(12) United States Patent
Lin et al.

(10) Patent No.: US 9,753,475 B2
(45) Date of Patent: Sep. 5, 2017

(54) FEEDBACK TYPE VOLTAGE REGULATOR

(71) Applicant: National Tsing Hua University, Hsin Chu (TW)

(72) Inventors: Yu-Po Lin, Miaoli County (TW); Kea-Tiong Tang, Taipei (TW)

(73) Assignee: National Tsing Hua University, Hsin Chu (TW)

( * ) Notice: Subject to any disclaimer, the term of this patent is extended or adjusted under 35 U.S.C. 154(b) by 67 days.

(21) Appl. No.: 14/846,816

(22) Filed: Sep. 6, 2015

(65) Prior Publication Data

US 2017/0003699 A1 Jan. 5, 2017

(30) Foreign Application Priority Data

Jun. 30, 2015 (TW) .............................. 104121183 A (51) Int. Cl.
*G05F 1/575* (2006.01)

(52) U.S. Cl.
CPC ........ *G05F 1/575* (2013.01); *H03F 2200/234* (2013.01)

(58) Field of Classification Search
CPC ............ G05F 1/575; G05F 1/56; G05F 1/561; G05F 1/563; G05F 1/461; G05F 1/462; G05F 1/465; H03F 2200/168; H03F 2200/153; H03F 2200/135; H03F 2200/129; H03F 2200/234; H03F 2203/45276

See application file for complete search history.

(56) References Cited

U.S. PATENT DOCUMENTS

| | | | | |
|---|---|---|---|---|
| 6,552,448 B1* | 4/2003 | Gegner | .............. | G01R 33/3852 307/54 |
| 6,788,140 B2* | 9/2004 | Cameron | .............. | H03F 1/3223 330/149 |
| 6,842,068 B2* | 1/2005 | Perrier | .................... | G05F 1/575 323/280 |
| 6,977,490 B1* | 12/2005 | Zhang | .................... | G05F 1/575 323/280 |
| 2003/0111985 A1* | 6/2003 | Xi | .......................... | G05F 1/575 323/273 |
| 2007/0115051 A1* | 5/2007 | Sutardja | .................... | H03F 1/08 330/100 |

(Continued)

OTHER PUBLICATIONS

Marco Ho, Ka Nang Leung, Ki-Leung Mak; A Low-Power Fast-Transient 90-nm Low-Dropout Regulator with Multiple Small-Gain Stages; Nov. 2010; IEEE Journal of Solid-State Circuits, vol. 45, No. 11; pp. 2466-2475.*

*Primary Examiner* — Harry Behm
(74) *Attorney, Agent, or Firm* — Chih Feng Yeh; Huntington IP Consulting Co. Ltd.

(57) ABSTRACT

The present invention discloses a feedback type voltage regulator, including a voltage reference circuit for providing a reference voltage, distributed series feedback amplifiers electrically coupled to the voltage reference circuit and a power transistor which gate is electrically connected to the distributed series feedback amplifiers. The distributed series feedback amplifiers comprises three set of amplifiers serially connected with each other, wherein the relation of the gain of the first amplifier (A1), the second amplifier (A2), and the third amplifier (A3) is A1>A2>A3, wherein the relation of the bandwidth of the first amplifier (B1), the second amplifier (B2), and the third amplifier (B3) is B1<B2<B3.

10 Claims, 4 Drawing Sheets

(56) References Cited

U.S. PATENT DOCUMENTS

| | | | | |
|---|---|---|---|---|
| 2011/0101536 A1* | 5/2011 | Chiang | ............ | B82Y 30/00 |
| | | | | 257/773 |
| 2013/0271100 A1* | 10/2013 | El-Nozahi | ............ | G05F 1/468 |
| | | | | 323/280 |
| 2016/0018834 A1* | 1/2016 | Kronmueller | ............ | G05F 1/575 |
| | | | | 323/280 |

* cited by examiner

FEEDBACK TYPE VOLTAGE REGULATOR

CROSS-REFERENCE TO RELATED APPLICATION

The present application claims the benefit of TAIWAN Patent Application Serial Number 104121183 filed on Jun. 30, 2015, which is herein incorporated by reference.

TECHNICAL FIELD

The present invention relates to voltage regulator, and more specifically to a feedback type voltage regulator.

BACKGROUND OF RELATED ART

A regulator circuit is a circuit which stabilizes the power supply voltage supplied from the outside, and supplies the stable output voltage to an output terminal. Load is connected to the output terminal of a regulator circuit after an output capacitor (output capacitance) is connected. Thereby, the output voltage which was stabilized in the regulator circuit and smoothed with the output capacitor is supplied to load.

In the operation of electronic devices and circuits, when the input voltage can't meet the requirements of "minimum voltage difference", the performance of the regulator will change. In this case, the error amplifier for driving conducting element will enter fully conductive state, so that the loop gain is zero. This indicates that regulating capability of the input power supply voltage and load will become bad, and power supply rejection ratio will be substantially reduced. Therefore, the quality and performance of the regulator has become extremely important.

Closed loop negative feedback systems are commonly employed in linear integrated circuits. For instance, switching regulators use a feedback loop to monitor the output voltage in order to provide regulation. To ensure stability in any closed loop system, the Nyquist criterion must be met. The Nyquist criterion states that a closed loop system is stable if the phase shift around the loop is less than 180 degrees at unity gain. Typically, a compensation circuit is added to a feedback loop to modulate the phase shift of the feedback loop to obtain stability.

The frequency response of a linear circuit can be characterized by the presence of "poles" and "zeros." A "pole" is a mathematical term which signifies the complex frequency at which gain reduction begins. On the other hand, a "zero" signifies the complex frequency at which gain increase starts. Poles and zeros on the left half plane of a complex frequency plane or s-plane are considered normal and can be compensated. However, poles and zeros on the right half plane of a complex frequency plane are usually problematic and difficult to manipulate. Generally, a pole contributes a −90.degree. phase shift while a zero contributes a +90.degree. phase shift. A pole cancels out the phase shift of a zero for zeros in the left half plane. In designing a closed loop system with compensation, the location of the poles and zeros are manipulated so as to avoid a greater than 180.degree. phase shift at unity gain.

In a linear circuit, poles are created by placing a small capacitor on a node with a high dynamic impedance. If the capacitor is placed at a gain stage, the capacitance can be multiplied by the gain of the stage to increase its effectiveness. Each pole has a zero associated with it. That is, at some point, the dynamic resistance of the gain stage will limit the gain loss capable of being achieved by the capacitor. Thus, a zero can be created by placing a resistor in series with the gain reduction capacitor.

The traditional linear voltage regulator circuit comprises a power transistor and an error amplifier for feedback control. This will narrow the bandwidth of the circuit due to high-gain of the error amplifier, and can't effectively response instant changes of the load current. However, if the gain is reduced and band is increased, then causing stable voltage overshoot while can't provide accurate output voltage.

In the conventional voltage regulator circuit, the stimulation unit instantly changes the load current, causing undershoot or overshoot voltage in the power source. Thus, a slow transient response in the power source affects the normal operation of the stimulation unit, thereby affecting the signal acquisition unit overall detection accuracy and with a narrow band response. Therefore, the feedback type voltage regulator is proposed.

SUMMARY

One objective of the present invention is to provide a feedback type voltage regulator circuit, comprising a voltage reference circuit for providing a reference voltage; distributed series feedback amplifiers coupled to the voltage reference circuit; and a transistor, wherein an output terminal of the distributed series feedback amplifiers is electrically coupled to a gate of the transistor.

According to an aspect of the invention, the circuit further comprises a load resistor electrically connected to an electrode of the transistor. The transistor is a power transistor. The distributed series feedback amplifiers comprise a first amplifier, a second amplifier and a third amplifier, wherein the first amplifier, the second amplifier and the third amplifier are cascaded electrically connected. A gain of the first amplifier is larger than that of the second amplifier, and a gain of the second amplifier is larger than that of the third amplifier. A bandwidth of the first amplifier is smaller than that of the second amplifier, and a bandwidth of the second amplifier is smaller than that of the third amplifier.

According to another aspect of the invention, distributed series feedback amplifiers comprise a two-stage error amplifier and a two-way compensation amplifier. The two-stage error amplifier includes a first amplifier, a second amplifier, a first resistor, a first capacitor, a second resistor, a second capacitor, a Miller-compensated capacitor, and a third resistor, wherein the first amplifier and the second amplifier are cascaded to construct a set of error amplifier. Miller-compensated capacitor and the third resistor are serially electrically connected with each other, and bridged an input terminal of the second amplifier and an output terminal of the second amplifier. The two-way compensation amplifier includes a third amplifier, a fourth amplifier, a third resistor, a third capacitor, a fourth resistor, a fourth capacitor, a first compensator and a second compensator, wherein the third amplifier and the fourth amplifier are cascaded. The first compensator is feeding a first voltage into an output terminal of the third amplifier, and second compensator is feeding a second voltage into an output terminal of the fourth amplifier. The first compensator and the second compensator are high-frequency compensator.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustration. Besides the preferred embodiment mentioned here, the present invention can be practiced in a wide range of other embodiments besides those explicitly described, and the scope of the present invention is expressly not limited except as specified in the accompanying Claims.

The present invention proposes a circuit system scheme, including a voltage reference circuit, distributed series feedback amplifiers and a power transistor. The distributed series feedback amplifiers comprise cascaded three set of amplifiers with respective gain and band to provide various frequency response, wherein the relation of the gain of the first amplifier (A1), the second amplifier (A2), and the third amplifier (A3) is A1>A2>A3, and wherein the relation of the bandwidth of the first amplifier (B1), the second amplifier (B2), and the third amplifier (B3) is B1<B2<B3. The circuit shares three gain stages through serial connection, and provide different bandwidth feedback path through parallel feedback to achieve the purpose of bandwidth extension.

In the concept of the present invention, bandwidth in its entirety of cascaded high-gain amplifiers becomes relatively reduced due to high gain. Thus, inputs of the amplifiers of the invention are divided into several inputs and different bandwidth amplifiers are performed through different inputs. Therefore, the amplifier closer to the power transistor has wider bandwidth and lower gain. Such a circuit design, the amplifier far from the power transistor has higher gain, so it does not need too wide bandwidth, because there is pre-stage amplifier compensating for bandwidth. Thus, the distributed series feedback amplifiers of the present invention can be constructed by multiple sets of cascaded amplifiers circuit (for example: 2, 3, 4 or more sets of cascaded amplifiers). In the distributed series feedback amplifiers, the amplifier far from the power transistor is, the gain of the amplifier is higher, and the amplifier far from the power transistor, the bandwidth of the amplifier is lower.

Figure 1:
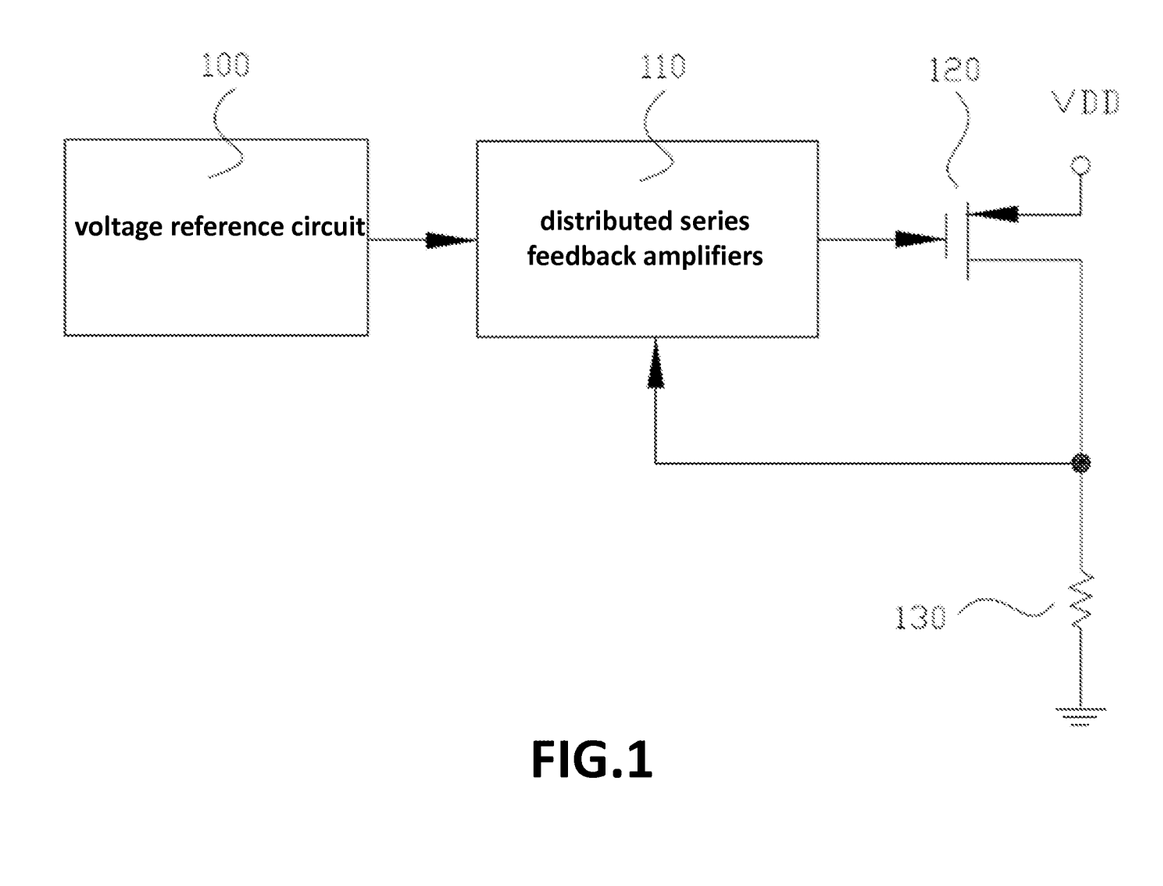
FIG. 1 illustrates a circuit system of a feedback type voltage regulator according to one embodiment of the invention.

Please refer to FIG. 1, it illustrates a circuit system according to the invention. The circuit system includes a voltage reference circuit 100, distributed series feedback amplifiers 110, a power transistor 120 and a load resistor 130. The voltage reference circuit 100 is electrically coupled to the distributed series feedback amplifiers 110, and the distributed series feedback amplifiers 110 is electrically coupled to the power transistor 120. The voltage reference circuit 100 is used to provide a reference voltage.

Figure 2:
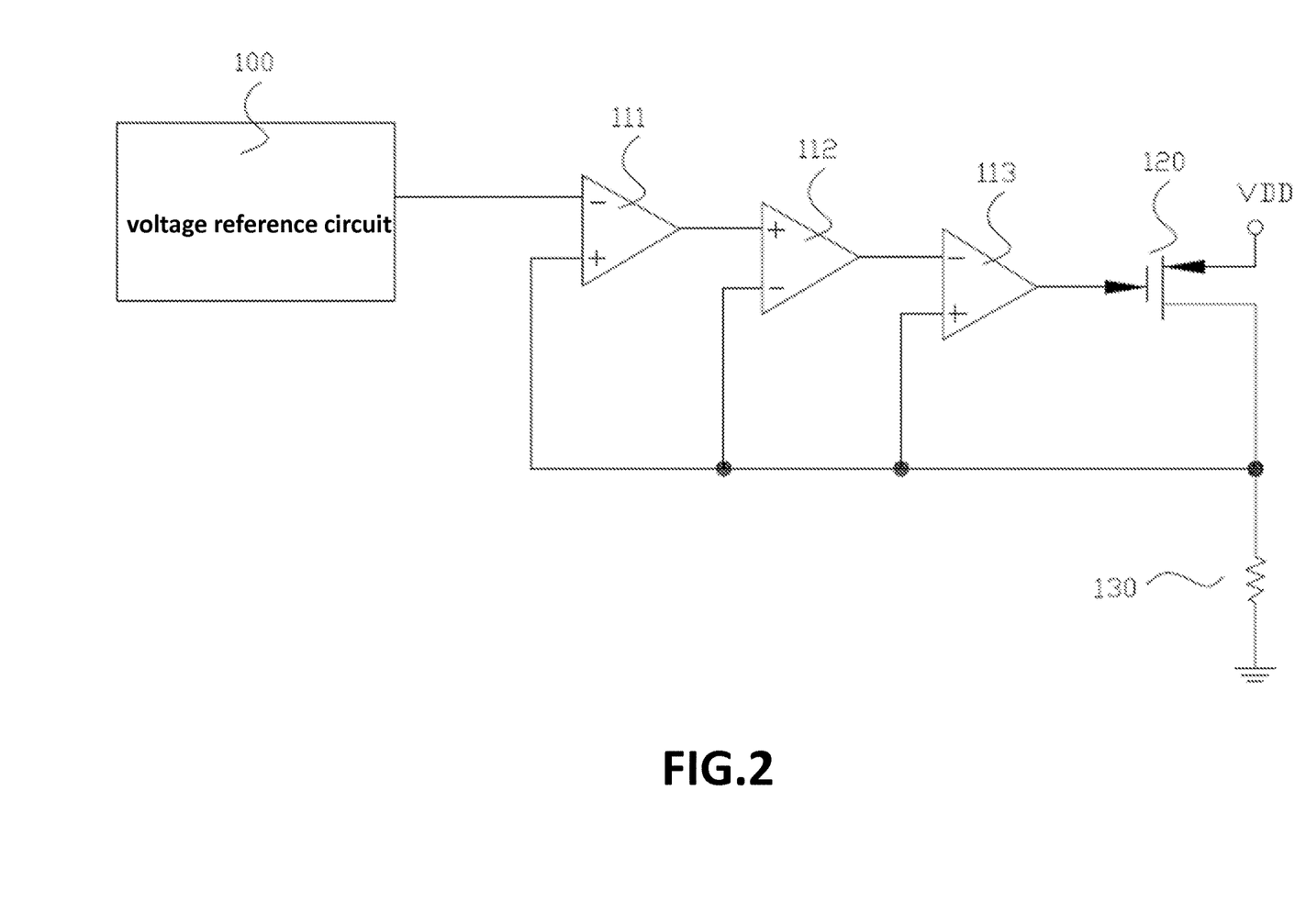
FIG. 2 distributed series feedback amplifiers of the circuit system of a feedback type voltage regulator of the invention.

Please refer to FIG. 2, it illustrates distributed series feedback amplifiers of the circuit system according to one embodiment of the invention. The distributed series feedback amplifiers comprise three set of serial amplifier circuits to provide various frequency responses. The three set of serial amplifier circuits with their respective bandwidths and gains, includes a first amplifier 111, a second amplifier 112 and a third amplifier 113. The relation of the gain of the first amplifier (gain A1), the second amplifier (gain A2), and the third amplifier (gain A3) is A1>A2>A3, and the relation of the bandwidth of the first amplifier (bandwidth B1), the second amplifier (bandwidth B2), and the third amplifier (bandwidth B3) is B1<B2<B3. Three stage gains may be shared by serially connected the three set of serial amplifier circuits with each other for parallel feedback to provide different bandwidth feedback paths to achieve the purpose of bandwidth extension. An input terminal of the first amplifier 111, the second amplifier 112 and the third amplifier 113 is electrically coupled to a feedback-end. In one embodiment, a positive input terminal of the first amplifier 111, a negative input terminal of the second amplifier 112 and a positive input terminal of the third amplifier 113 are electrically coupled to a feedback-end. Another input terminal of the first amplifier 111 is electrically coupled to the voltage reference circuit 100, and an output terminal of the third amplifier 113 is electrically coupled to a gate of the power transistor 120. Source electrode of the power transistor 120 is electrically coupled to an input voltage (VDD), and drain electrode of the power transistor 120 is electrically connected to a resistor 130. Another end of the resistor 130 is grounded.

Figure 3:
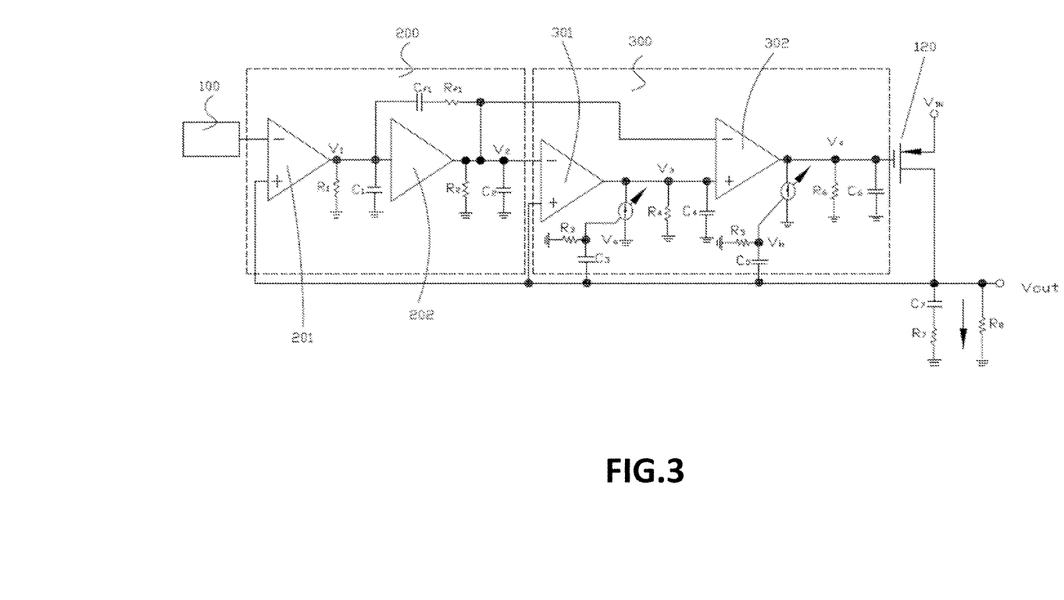
FIG. 3 illustrates a feedback type linear voltage regulator circuit according to one embodiment of the invention.

Please refer to FIG. 3, it illustrates a feedback type linear voltage regulator circuit according to one embodiment of the invention. As shown in FIG. 3, in this embodiment, it presents a conceptual diagram of the proposed hybrid-structure low dropout (LDO) regulator which comprise a voltage reference circuit 100, a pass transistor 120, a two-stage error amplifier 200 and a two-way compensation amplifier 300. For example, the voltage reference circuit 100 comprises a current source and a bias-voltage circuit. In one embodiment, the current source is a modified multiplier self-biasing circuit with a resistor to generate a current, and then produce a reference voltage through the bias-voltage circuit. The reference voltage generated by the voltage reference circuit 100 is then feeding into the two-stage error amplifier 200.

The voltage reference circuit 100 is electrically coupled to the two-stage error amplifier 200. The two-way compensation amplifier 300 is electrically coupled to the two-stage error amplifier 200 and the pass transistor 120. In one embodiment, the two-stage error amplifier 200 comprises an amplifier 201, an amplifier 202, a first resistor $R_1$, a first capacitor $C_1$, a second resistor $R_2$, a second capacitor $C_2$, a Miller-compensated capacitor ($C_{f1}$), and a resistor $R_{f1}$, wherein the amplifier 201 and the amplifier 202 are cascaded to construct a set of error amplifier. The first resistor $R_1$ and the first capacitor $C_1$ are configured in parallel and electrically configured between the amplifier 201 and the amplifier 202. A first terminal of the first resistor $R_1$ and the first capacitor $C_1$ is electrically coupled to an output terminal of the amplifier 201. The second resistor $R_2$ and the second capacitor $C_2$ are configured in parallel and a first terminal of the second resistor $R_2$ and the second capacitor $C_2$ is electrically coupled to an output terminal of the amplifier 202. The Miller-compensated capacitance ($C_{f1}$), and the resistor $R_{f1}$ are serially electrically connected with each other and bridged an input terminal of the amplifier 202 and an output terminal of the amplifier 202. The Miller-compensated capacitance ($C_{f1}$) is electrically connected to the input terminal of the amplifier 202, and the resistor $R_{f1}$ is electrically connected to the output terminal of the amplifier 202.

A terminal of the resistor $R_{f1}$ is electrically configured to a point between a terminal of the second resistor $R_2$ and the second capacitor $C_2$.

In one embodiment, the two-way compensation amplifier 300 comprises an amplifier 301, an amplifier 302, a third resistor $R_4$, a third capacitor $C_4$, a fourth resistor $R_6$, a fourth capacitor $C_6$, a first compensator and a second compensator, wherein the amplifier 301 and the amplifier 302 are cascaded. The first compensator is configured below the amplifier 301 of the FIG. 2, and the second compensator is configured below the amplifier 302 of the FIG. 2. During operation, the first compensator is feeding a voltage $V_a$ into an output terminal of the amplifier 301, and the second compensator is feeding a voltage $V_b$ into an output terminal of the amplifier 302. For example, the first compensator and the second compensator are high-frequency compensator.

The third resistor $R_4$ and the third capacitor $C_4$ are configured in parallel and electrically configured between the amplifier 301 and the amplifier 302. A first terminal of the third resistor $R_4$ and the third capacitor $C_4$ is electrically coupled to an output terminal of the amplifier 301 and the first comparator. The fourth resistor $R_6$ and the fourth capacitor $C_6$ are configured in parallel, and a first terminal of the fourth resistor $R_6$ and the fourth capacitor $C_6$ is electrically coupled to an output terminal of the amplifier 302 and the second comparator, and a gate electrode of the pass transistor 120. The first comparator comprises a resistor $R_3$ and a capacitance $C_3$ which are serially electrically connected with each other, and an input voltage of the first comparator is feeding into a point (node) between the resistor $R_3$ and the capacitance $C_3$. The second comparator comprises a resistor $R_5$ and a capacitance $C_5$ which are serially electrically connected with each other, and an input voltage of the second comparator is feeding into a point (node) between the resistor $R_5$ and the capacitance $C_5$. A voltage feeding point (node) of the first comparator is electrically connected to an output terminal of the amplifier 301. A voltage feeding point (node) of the second comparator is electrically connected to an output terminal of the amplifier 302.

An another terminal of the first resistor $R_1$, the first capacitance $C_1$, the second resistance $R_2$, the second capacitance $C_2$, the third resistor $R_4$, the third capacitance $C_4$, the fourth resistor $R_6$, the fourth capacitance $C_6$, and the resistance $R_3$ and $R_5$ is grounded.

An input terminal (such as negative electrode) of the amplifier 201 of the two-stage error amplifier 200 is electrically coupled/connected to the voltage reference circuit 100 for receiving a reference voltage ($V_{ref}$) generated by the voltage reference circuit 100, and another input terminal (such as positive electrode) of the amplifier 201 is electrically coupled/connected to the feedback end of voltage output. An input terminal (such as negative electrode) of the amplifier 301 of the two-way compensation amplifier 300 is electrically coupled/connected to the amplifier 202 of the two-stage error amplifier 200 for receiving a voltage ($V_2$) outputted by the amplifier 202, and another input terminal (such as positive electrode) of the amplifier 301 is electrically coupled/connected to the feedback end of voltage output. Moreover, another terminal of the capacitance $C_3$ of the first comparator and the capacitance $C_5$ of the second comparator is electrically coupled/connected to the feedback end of voltage output.

The reference voltage ($V_{ref}$) generated by the voltage reference circuit 100 is fed into the amplifier 201 of the two-stage error amplifier 200, and then outputting a voltage $V_1$. The voltage $V_1$ is fed into the amplifier 202 of the two-stage error amplifier 200 to output a voltage $V_2$. The output voltage $V_2$ of the two-stage error amplifier 200 is then fed into an input terminal (such as negative electrode) of the amplifier 301 of the two-way compensation amplifier 300, followed by processing by the amplifier 301 to output a voltage $V_3$ fed into an input terminal (such as positive electrode) of the amplifier 302. Herein, the cascaded Miller-compensated capacitance ($C_{f1}$) and the resistor $R_{f1}$ of the two-stage error amplifier 200 is electrically coupled to an input terminal (such as negative electrode) of the amplifier 302 of the two-way compensation amplifier 300. Therefore, an output voltage $V_4$ of the amplifier 302 may be adjusted by the followings: (1) output voltage $V_1$ of the amplifier 201, through the cascaded Miller-compensated capacitance ($C_{f1}$) and the resistor $R_{f1}$ coupled to an input terminal (such as positive electrode) of the amplifier 302; (2) output voltage $V_3$ of the amplifier 301, coupled to another input terminal (such as negative electrode) of the amplifier 302; (3) feeding voltage $V_a$ of the first comparator, coupled to another input terminal (such as negative electrode) of the amplifier 302. The output voltage $V_4$ of the amplifier 302 is electrically coupled to gate terminal of the pass transistor 120. A voltage $V_{IN}$ is introduced into source terminal of the pass transistor 120, and output voltage $V_4$ of the amplifier 302 is fed into the gate terminal of the pass transistor 120. Then, a voltage (or current) is generated at drain terminal of the pass transistor 120 and followed by transmitting to the feedback end or outputting the output voltage $V_{OUT}$. The feedback end is electrically coupled to a terminal of the cascaded a capacitance $C_7$ and a resistance $R_7$, and coupled to a resistance $R_8$. Another terminal of the resistance $R_7$ and the resistance $R_8$ is grounded.

As noted above, the hybrid-structure low dropout (LDO) regulator comprise a two-stage high-gain error amplifier 200 and a two-way compensation amplifier 300, wherein the two-stage error amplifier 200 has a Miller-compensated capacitance ($C_{f1}$) for coarsely tuning the feedback amount, and a resistor $R_{f1}$ for introducing a left half plane zero to increase the phase margin, and wherein the two-way compensation amplifier 300 has high-frequency compensator for finely tuning the feedback amount. Similar to a traditional error amplifier, the Miller compensation may be added to enhance the stability due to the high loop gain. However, this narrows the bandwidth of the loop gain. Thus, the two-way compensation amplifier 300 is cascaded to broaden the bandwidth of the loop gain and improve the transient response. The high-frequency compensation technique was adopted to enhance the high frequency response in the proposed LDO regulator. The high frequency compensation may be implemented by selecting an appropriate transconductance of the first comparator (below of the amplifier 301 in FIG. 3) and the second comparator (below of the amplifier 302 in FIG. 3), and time constants $R_{f2}C_{f2}$ and $R_{f3}C_{f3}$, as shown in FIG. 3.

To understand the frequency response of the proposed LDO regulator, standard circuit analysis methods may be employed to calculate the transfer function of the feedback factor. By the circuit analysis method, the feedback factor (loop gain) can be simplified as the equation (1):

$$\beta(s) = \frac{V_{o3}}{V_{out}} = \frac{R_{o3}}{1 + sC_{o3}R_{o3}} \left\{ -G_{m31}\left(G_{m21}\frac{R_{o2}}{1 + sC_{o2}R_{o2}} + 1\right)A_1(s) + \right. \quad (1)$$

$$G_{m31}\left[G_{m21} + G_{m22}\left(\frac{sC_{f2}R_{f2}}{1 + sC_{f2}R_{f2}}\right)\right]\frac{R_{o2}}{1 + sC_{o2}R_{o2}} +$$

$$G_{m32} \frac{sC_{f3}R_{f3}}{1+sC_{f3}R_{f3}} \bigg\}$$

The transfer function of the two-stage error amplifier 200 can be simplified as the equation (2):

$$A_1(s) \approx \frac{A_{o1}}{1+\tau_{p1}s} = \frac{G_{m11}R_{o11}G_{m12}R_{o12}}{1-sG_{m12}R_{o12}C_{f1}R_{o11}} \quad (2)$$

To reduce the order of the feedback factor in the equation (1) and to simplify the design, a small time constant $R_4C_4$ at the second stage output of the two-way compensation amplifier 300 is chosen, the feedback factor (loop gain) can be simplified as the equation (3):

$$\beta(s) = \frac{V_{o3}}{V_{out}} \approx \frac{R_{o3}}{1+sC_{o3}R_{o3}} \bigg\{ -G_{m31}(G_{m21}R_{o2}+1)A_1(s) + \quad (3)$$
$$G_{m31}\bigg[G_{m21} + G_{m22}\bigg(\frac{sC_{f2}R_{f2}}{1+sC_{f2}R_{f2}}\bigg)\bigg]R_{o2} + G_{m32}\frac{sC_{f3}R_{f3}}{1+sC_{f3}R_{f3}} \bigg\}$$

$V_{o3}$、$R_{o3}$、$C_{o3}$、$R_{o2}$、$C_{o2}$、$C_{f2}$、$R_{f2}$、$C_{f3}$、$R_{f3}$、$R_{o11}$、$R_{o12}$ in the equations (1)-(3) indicate respectively $V_4$、$R_6$、$C_6$、$R_4$、$C_4$、$C_3$、$R_3$、$C_5$、$R_5$、$R_1$、$R_2$ shown in FIG. 3. $G_{m31}$、$G_{m21}$、$G_{m22}$、$G_{m32}$、$G_{m12}$、$G_{m11}$ in the equations (1)-(3) indicate respectively transconductance of the amplifier 301, the amplifier 302, the first comparator, the second comparator, the amplifier 201, and the amplifier 202 shown in FIG. 3.

Equation (3) indicates that the feedback factor ($\beta(s)$) can be divided into two parts: (1) a high-gain with a narrow band response resulting from the Miller effect in the error amplifier 200 as in $A_1(s)$, and (2) a middle-gain with a wide-band response resulting from the two high-pass transconductance paths in the two-way compensation amplifier 300. Hence, the loop gain of the proposed hybrid-structure LDO regulator exhibits both high-gain and wide-bandwidth characteristics.

Equation (3) indicates that the loop gain of the proposed hybrid-structure LDO regulator is consisted of transfer function $A_1(s)$ and others high frequency terms. The transfer function $A_1(s)$ represents low frequency gain stage and others items represents high frequency gain stage. Hence, two type frequency gains are provided by the low and high frequency gain stage to efficiently expand bandwidth range.

Figure 4:
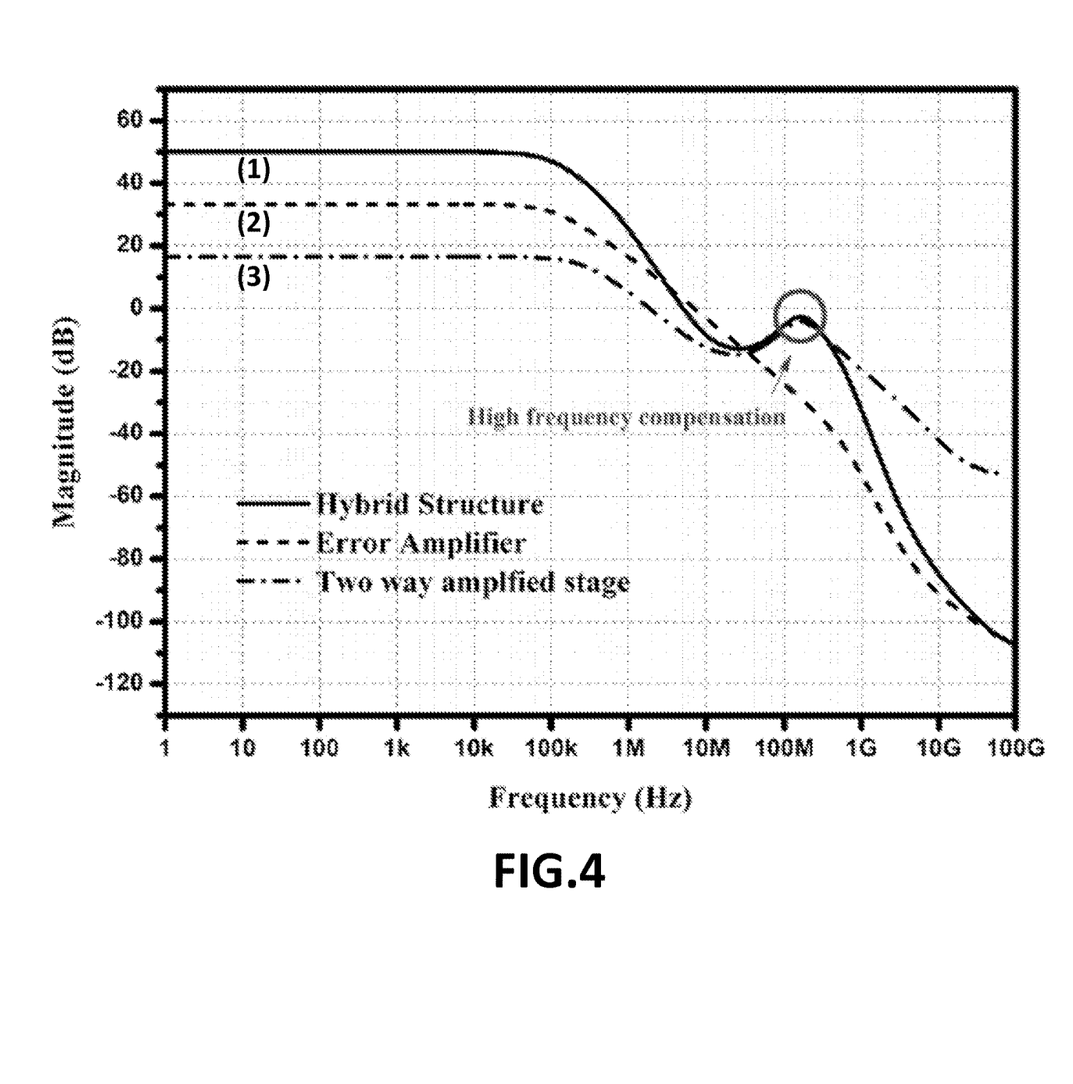
FIG. 4 illustrates a simulated result of the feedback type linear voltage regulator circuit according to the invention.

Please refer to FIG. 4, it illustrates a simulated result of the feedback type linear voltage regulator circuit according to the invention. FIG. 4 presents the simulated frequency response of the proposed two-stage hybrid-structure amplifier (without pass transistor). As shown in FIG. 4, curve (1) indicates gain versus frequency response of the proposed two-stage hybrid-structure amplifier (two-stage error amplifier 200 and two-way compensation amplifier 300), curve (2) indicates gain versus frequency response of the two-stage error amplifier 200, and curve (3) indicates gain versus frequency response of the two-way compensation amplifier 300. Small circle shown in FIG. 4 indicates high frequency compensation. The gain of the proposed hybrid-structure amplifier may be increased from 38 to 50 dB while maintaining a similar bandwidth compared with error amplifier. The results show that the hybrid-structure amplifier has better stability compared with error amplifier by increasing phase margin about 34. Moreover, the high frequency error amplifier is to enhance high, low frequency gain, and the two-way compensation amplifier provides high frequency gain. The high frequency compensator is used to compensate large signal characteristic. The simulated result of various gain stages is shown in FIG. 4, which indicates that the error amplifier provides about 35 dB gain, and the high frequency amplifier provide about 18 dB gain. The hybrid-structure amplifier provides about 50 dB gain without reducing bandwidth.

The invention provides a feedback type linear voltage regulator circuit. Backend of the first stage (high gain stage) error amplifier is inserted by two set high frequency, low gain amplifiers for feedback controlling gate voltage of the pass transistor. The two set amplifiers and the pass transistor is constructed to provide a high frequency feedback controlling path. Bandwidth of the circuit system can be increased through the high frequency feedback controlling path, and the three set amplifiers and the pass transistor are co-constructed to be another low bandwidth, high gain amplifiers feedback controlling path. The three feedback paths allow the system with the benefit of high bandwidth and high gain. We propose a novel hybrid feedback structure using high-frequency compensation technology to achieve a rapid transient response for the LDO regulator. With comparison to the traditional regulator circuit, the invention can effectively improve bandwidth, and significantly achieve a rapid transient response for different usage requirements or load current. In addition, by adjusting the gains of the three amplifiers circuit, or add more levels (more than three gain stages) amplifiers to form more sets of amplifiers with respective bandwidth and gain and feedback path.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A feedback type voltage regulator circuit, comprising:
   a voltage reference circuit for providing a reference voltage;
   distributed series feedback amplifiers coupled to said voltage reference circuit, wherein said distributed series feedback amplifiers comprise a two-stage error amplifier, said two stage error amplifier comprise a first amplifier, a second amplifier, a two-way compensation amplifier, said two-way compensation amplifier comprise a third amplifier, wherein said first amplifier, said second amplifier and said third amplifier are cascaded electrically connected; and wherein a gain of said first amplifier is larger than that of said second amplifier, and a gain of said second amplifier is larger than that of said third amplifier, said distributed series feedback amplifiers are divided into several inputs and designed for high-gain, wide-bandwidth and high-frequency compensation characteristics; and a transistor, wherein an output terminal of said distributed series feedback amplifiers is electrically coupled to a gate of said transistor.

2. The circuit in claim 1, further comprising a load resistor electrically connected to an electrode of said transistor.

3. The circuit in claim 1, wherein said transistor is a power transistor.

4. The circuit in claim 1, wherein a bandwidth of said first amplifier is smaller than that of said second amplifier, and a bandwidth of said second amplifier is smaller than that of said third amplifier.

5. The circuit in claim 1, wherein said two-stage error amplifier includes a first amplifier, a second amplifier, a first resistor, a first capacitor, a second resistor, a second capacitor, a Miller-compensated capacitor, and a third resistor, wherein said first amplifier and said second amplifier are cascaded to construct a set of error amplifier.

6. The circuit in claim 5, wherein said Miller-compensated capacitor and said third resistor are serially electrically connected with each other, and bridged an input terminal of said second amplifier and an output terminal of said second amplifier.

7. The circuit in claim 1, wherein said two-way compensation amplifier includes a third amplifier, a fourth amplifier, a third resistor, a third capacitor, a fourth resistor, a fourth capacitor, a first compensator and a second compensator, wherein said third amplifier and said fourth amplifier are cascaded.

8. The circuit in claim 7, wherein said first compensator is feeding a first voltage into an output terminal of said third amplifier.

9. The circuit in claim 8, wherein said second compensator is feeding a second voltage into an output terminal of said fourth amplifier.

10. The circuit in claim 9, wherein said first compensator and said second compensator are high-frequency compensator.

* * * * *

UNITED STATES PATENT AND TRADEMARK OFFICE
CERTIFICATE OF CORRECTION

PATENT NO. : 9,753,475 B2
APPLICATION NO. : 14/846816
DATED : September 5, 2017
INVENTOR(S) : Yu-Po Lin, Kea-Tiong Tang and Hsin Chen It is certified that error appears in the above-identified patent and that said Letters Patent is hereby corrected as shown below:

On the Title Page

Item [72] add a third Inventor -- Hsin Chen, Hsin Chu City (TW) --.

Signed and Sealed this
Tenth Day of July, 2018

Andrei Iancu
*Director of the United States Patent and Trademark Office*